Figure 1:
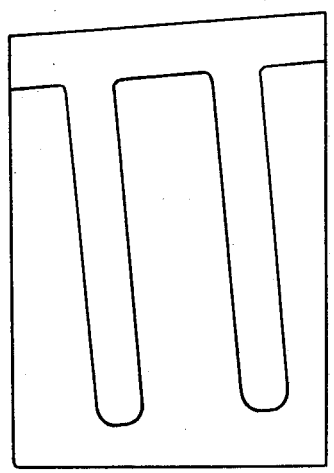

United States Patent [19]

Gerlach et al.

[11] 4,097,394

[45] Jun. 27, 1978

[54] ETCHING LIQUID FOR ETCHING ALUMINUM

[75] Inventors: Gijsbertus Gerlach; John Joseph Kelly, both of Eindhoven, Netherlands

[73] Assignee: U.S. Philips Corporation, New York, N.Y.

[21] Appl. No.: 792,641

[22] Filed: May 2, 1977

Related U.S. Application Data

[63] Continuation of Ser. No. 607,557, Aug. 25, 1975, abandoned.

[30] Foreign Application Priority Data

Sep. 3, 1974  Netherlands .......................... 7411645

[51] Int. Cl.$^2$ ....................... C09K 13/02; C23F 00/00
[52] U.S. Cl. ................................... 252/79.5; 156/656; 156/659; 156/665; 252/156

[58] Field of Search ............... 252/79.5, 156; 156/640, 156/656, 659, 661, 665, 650–652, 643; 204/192 EC

[56] References Cited

U.S. PATENT DOCUMENTS 3,168,478  2/1965  Stefcik et al. ..................... 252/156 X
3,532,569  10/1970  Gould ............................. 252/79.5 X

*Primary Examiner*—William A. Powell
*Attorney, Agent, or Firm*—Frank R. Trifari; Norman N. Spain

[57]  ABSTRACT

Etching liquid for selectively etching aluminum and alloys, which consists of a solution of carbonate and/or hydroxide, phosphate and ferricyanide. This etching liquid gives products having very good boundary resolution and little undercutting.

6 Claims, 2 Drawing Figures

ETCHING LIQUID FOR ETCHING ALUMINUM

This is a continuation, of application Ser. No. 607,557, filed Aug. 25, 1975, now abandoned.

The invention relates to an etching liquid for etching aluminium and aluminium-base alloys.

In the semiconductor industry, in particular in what is generally referred to as thin film technology, aluminum is frequently used for making high-resolution patterns by photo-etching techniques. Aluminum is also used for making electrodes in certain types of display panels. These electrodes have complicated shapes and preferably are also made by means of the photo-etching technique.

U.S. Pat. No. 3,532,569 describes an etchant which consists of an aqueous solution which contains at least 5 g/l up to saturation of an alkali metal ferricyanide or ammonium ferricyanide and from 0.05 to 2 moles/l of an alkali metal hydroxide for each mole/l of the said ferricyanide and which is stated to be particularly suitable for selective etching of aluminum films deposited from vapour. This etchant differs from the known etching liquids for aluminum, such as the liquid described in U.S. Pat. No. 3,281,293 which contains $FeCl_3$ and persulphate, by the far higher resolution and the far smaller undercutting obtained.

We found that for articles of greater thickness, such as springs or electrodes at least 100 μm thick, the said etching liquid does not give satisfactory results in respect of boundary sharpness of the products obtained. Also, difficulties were experienced in the case of bimetallic systems where high-resolution patterns are to be etched in aluminum films which are partly coated with a nobler metal. Configurations of this type are used in thin-film technology. Because of the electrolytic effect due to the metallic contact the known baths give increased undercutting with respect to a thin-layer technique in which an organic photoresist is used for covering.

It is an object of the present invention to provide an etchant which for articles of greater thickness gives perfect boundary sharpness and for thinner layers in bimetallic systems gives far less undercutting.

The etching liquid which consists of an aqueous solution having a pH value of at least 11.5, of an alkali metal carbonate in an amount between 0.1 and 2 mole/l and/or of an alkali metal hydroxide and a soluble ferricyanide in an amount between 5 g/l and saturation, where the molar ratio of hydroxide to ferricyanide is at most equal to 1, is characterized according to the invention also in that the solution contains a soluble salt of an acid derived from trivalent or pentavalent phosphorus oxide.

The results obtained with this bath are far superior to those obtained by the known bath, as will be seen from the comparative date in the following Examples.

EXAMPLE 1

Figure 2:
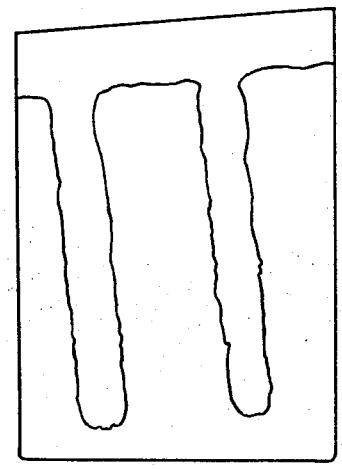

An aluminum foil thick 200 μm was coated with a photoresist, such as Kodak KPR2, exposed to light behind a negative of a desired pattern and developed. The foil was then etched in a spray etching machine by means of an etching liquid heated to 56° C and having the following composition per liter:

25 g NaOH
30 g $Na_2HPO_4.12H_2O$
330 g $K_3Fe(CN)_6$. This liquid etches at a rate of 8 μm/minute. For comparison an identical foil is processed in the same manner, except that an etching liquid is used having the following composition per liter:

25 g NaOH
330 g $K_3Fe(CN)_6$. The accompanying Figures are drawings of two micrographs magnified 50 times. FIG. 1 shows the result obtained by the use of the etching liquid according to the invention, and FIG. 2 shows the result obtained by using the known bath. The difference in boundary sharpness is evident.

EXAMPLE 2

A glass plate was coated by deposition from vapour with a film of aluminum 0.4 μm thick, which in turn is coated with a layer of platinum 0.1 μm thick, after which a photosensitive electrolytic resist film such as "Waycoat positive resist", was applied. By exposing to light behind a pattern and developing, the resist layer outside the desired pattern is obtained. The glass plate then is reinforced according to this pattern with a gold film 1.0 μm thick by means of a conventional electroplating bath. Subsequently the resist coating and then the consequently bared thin Pt layer are removed by "sputter etching". The resulting exposed aluminum layer is etched away by means of an etching liquid which is continuously stirred, is maintained at a temperature of 24° C and has the following composition per liter:

150 g $Na_2CO_3$
70 g $Na_3PO_4.12H_2O$
32 g $K_3Fe(CN)_6$ The etching rate is 0.2 μm/minute. An identical plate is treated in the same manner, however, the aluminum is removed by etching in the above-mentioned bath from which the phosphate is omitted but to which NaOH is added to a pH value of 12. In the first case the undercutting was about 0.5 μm and in the second case no less than 8.5 μm. Comparable results are obtained if the orthophosphate is replaced by metaphosphate, polyphosphate, pyrophosphate or phosphite.

What is claimed is:

1. An etching solution for selectively etching layers at least 100 μ thick of aluminum and alloys of aluminum, said solution having a pH of at least 11.5 and being an aqueous solution of at least one alkaline material selected from the group consisting of alkali metal carbonates and alkali metal hydroxides in an amount of from 0.1 to 2 mole/l, a soluble ferricyanide in an amount of from 5 g/l to saturation, the molar ratio of hydroxide to ferricyanide being at most equal to 1 and a soluble salt of a phosphorus acid derived from trivalent or pentavalent phosphorous oxide selected from the group consisting of orthophosphates, metaphosphates, polyphosphates, pyrophosphates and phosphites in an amount sufficient to reduce undercutting.

2. The etching solution of claim 1 wherein the alkaline material is an alkali metal hydroxide.

3. The etching solution of claim 1 wherein the alkaline material is an alkali metal carbonate.

4. An etching solution for selectively etching layers of aluminum and alloys of aluminum partially covered with a noble metal, said solution having a pH of at least 11.5 and being an aqueous solution of at least one alkaline material selected from the group consisting of alkali metal carbonates and alkali metal hydroxides in an amount of from 0.1 to 2 mole/l, a soluble ferricyanide in an amount of from 5 g/l to saturation, the molar ratio of hydroxide to ferricyanide being at most equal to 1 and a soluble salt of a phosphorus acid derived from trivalent or pentavalent phosphorous oxide selected from the group consisting of orthophosphates, mataphosphates, polyphosphates, pyrophosphates and phosphites in an amount sufficient to reduce undercutting.

5. The etching solution of claim 4 wherein the alkaline material is an alkali metal hydroxide.

6. The etching solution of claim 4 wherein the alkaline material is an alkali metal carbonate.

* * * * *

UNITED STATES PATENT OFFICE
CERTIFICATE OF CORRECTION

Patent No. 4097394  Dated June 27, 1978

Inventor(s) GIJSBERTUS GERLACH: JOHN JOSEPH KELLY

It is certified that error appears in the above-identified patent and that said Letters Patent are hereby corrected as shown below:

Column 3, line 5, change "mataphosphates" to

--metaphosphates--

Change the inventor's name from "Gerlach" to -- Gerlagh --.

Signed and Sealed this

Fifteenth Day of May 1979

[SEAL]

Attest:

RUTH C. MASON
Attesting Officer

DONALD W. BANNER
Commissioner of Patents and Trademarks